United States Patent
Kirsch et al.

(10) Patent No.: US 8,723,211 B2
(45) Date of Patent: May 13, 2014

(54) OPTOELECTRONIC DEVICE WITH HOUSING BODY

(75) Inventors: Markus Kirsch, Brunn (DE); Simon Bluemel, Schierling (DE); Hans-Christoph Gallmeier, Regensburg (DE); Thomas Zeiler, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 128 days.

(21) Appl. No.: 12/529,151

(22) PCT Filed: Feb. 26, 2008

(86) PCT No.: PCT/DE2008/000342
§ 371 (c)(1),
(2), (4) Date: Oct. 27, 2009

(87) PCT Pub. No.: WO2008/104165
PCT Pub. Date: Sep. 4, 2008

(65) Prior Publication Data
US 2010/0065879 A1 Mar. 18, 2010

(30) Foreign Application Priority Data

Feb. 28, 2007 (DE) .......... 10 2007 009 818
May 10, 2007 (DE) .......... 10 2007 021 904

(51) Int. Cl.
*H01L 33/00* (2010.01)

(52) U.S. Cl.
USPC ........ 257/99; 257/98; 257/100; 257/E33.056; 257/E33.059; 438/26; 438/29

(58) Field of Classification Search
USPC ............... 257/99, 100, E33.056; 438/26, 64
See application file for complete search history.

(56) References Cited

U.S. PATENT DOCUMENTS

| | | | |
|---|---|---|---|
| 4,904,080 A * | 2/1990 | Afromowitz | 356/133 |
| 5,040,868 A | 8/1991 | Waitl et al. | |
| 6,610,563 B1 | 8/2003 | Waitl et al. | |
| 6,645,783 B1 | 11/2003 | Brunner et al. | |
| 2002/0008916 A1* | 1/2002 | Nishikawa et al. | 359/619 |
| 2002/0196563 A1* | 12/2002 | Itoh | 359/741 |
| 2004/0075100 A1* | 4/2004 | Bogner et al. | 257/99 |
| 2004/0201028 A1 | 10/2004 | Waitl et al. | |
| 2005/0145991 A1* | 7/2005 | Sakamoto et al. | 257/604 |
| 2005/0213334 A1 | 9/2005 | Lee et al. | |
| 2005/0218421 A1 | 10/2005 | Andrews et al. | |
| 2005/0221519 A1* | 10/2005 | Leung et al. | 438/27 |
| 2006/0022212 A1 | 2/2006 | Waitl et al. | |

(Continued)

FOREIGN PATENT DOCUMENTS

DE    26 32 462        1/1978
DE    197 55 734 A1    6/1999

(Continued)

*Primary Examiner* — Minhloan T Tran
*Assistant Examiner* — Fazli Erdem
(74) *Attorney, Agent, or Firm* — Slater & Matsil, L.L.P.

(57) ABSTRACT

A housing body for an optoelectronic component comprises a main surface having a first area region and a second area region. The first area region and the second area region form a step in the main surface. The first area region and the second area region adjoin one another by means of an outer edge. The second area region and the outer edge enclose the first area region.

24 Claims, 8 Drawing Sheets

(56) References Cited

U.S. PATENT DOCUMENTS

| | | |
|---|---|---|
| 2006/0022216 A1 | 2/2006 | Chikugawa |
| 2006/0114678 A1* | 6/2006 | Shimonishi et al. ........... 362/311 |
| 2006/0124953 A1* | 6/2006 | Negley et al. .................... 257/99 |
| 2007/0029569 A1* | 2/2007 | Andrews ......................... 257/99 |
| 2007/0045646 A1* | 3/2007 | Low et al. ....................... 257/98 |
| 2007/0217019 A1* | 9/2007 | Huang et al. .................. 359/642 |
| 2008/0023711 A1* | 1/2008 | Tarsa et al. ...................... 257/98 |
| 2008/0096298 A1* | 4/2008 | Chabinyc et al. ................ 438/29 |
| 2010/0258829 A1* | 10/2010 | Blumel et al. ................... 257/98 |
| 2011/0001152 A1* | 1/2011 | Chung et al. .................... 257/98 |
| 2012/0043555 A1* | 2/2012 | Tuan et al. ....................... 257/76 |

FOREIGN PATENT DOCUMENTS

| | | |
|---|---|---|
| EP | 1 022 787 A1 | 7/2000 |
| JP | 60-107874 | 6/1985 |
| JP | 09-027643 A | 1/1997 |
| JP | 09-270537 A | 10/1997 |
| JP | 2000-315823 | 11/2000 |
| JP | 2002-509362 A | 3/2002 |
| JP | 2002-329832 A | 11/2002 |
| JP | 2002-329892 A | 11/2002 |
| JP | 2004-512670 A | 4/2004 |
| JP | 2004-343059 A | 12/2004 |
| JP | 2005-167079 A | 6/2005 |
| JP | 2005-197369 A | 7/2005 |
| JP | 2005-259972 A | 9/2005 |
| JP | 2006-303359 A | 11/2006 |
| WO | WO 2005/098976 A2 | 10/2005 |

* cited by examiner

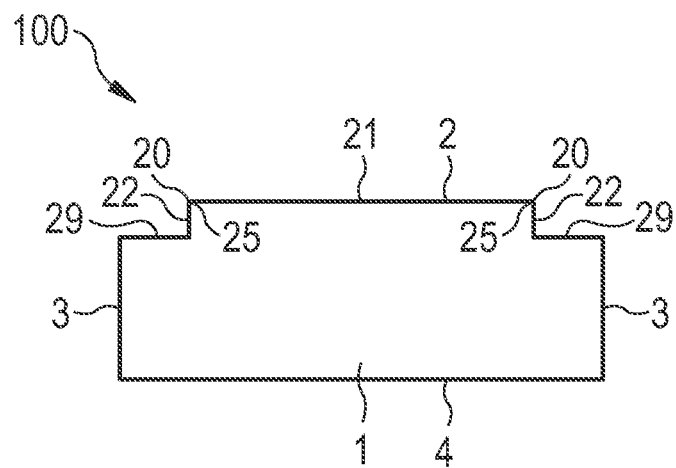
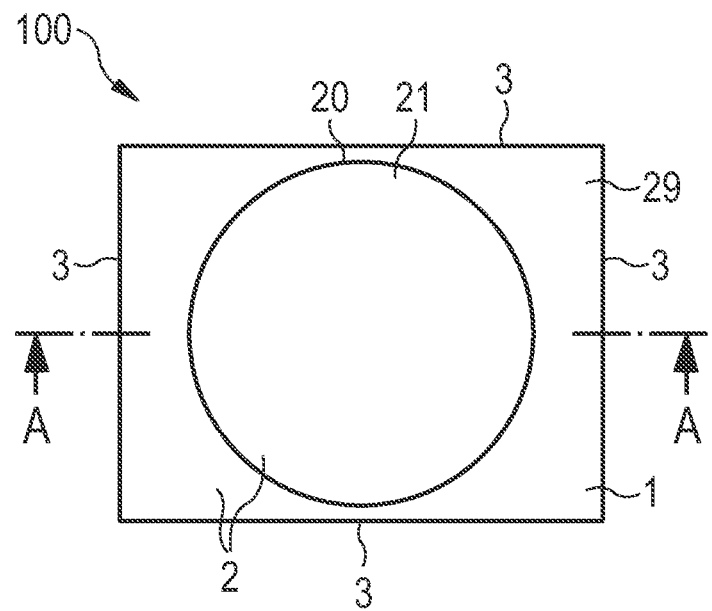

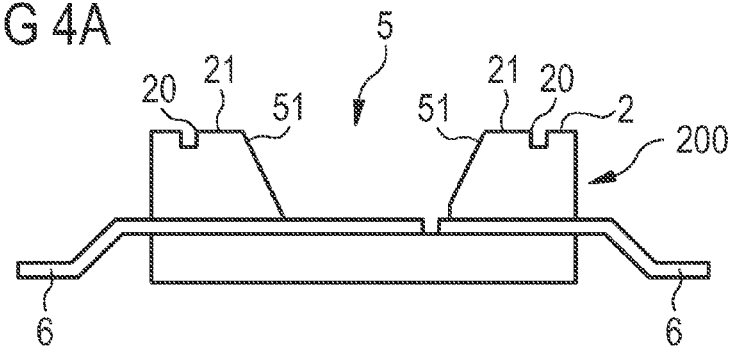
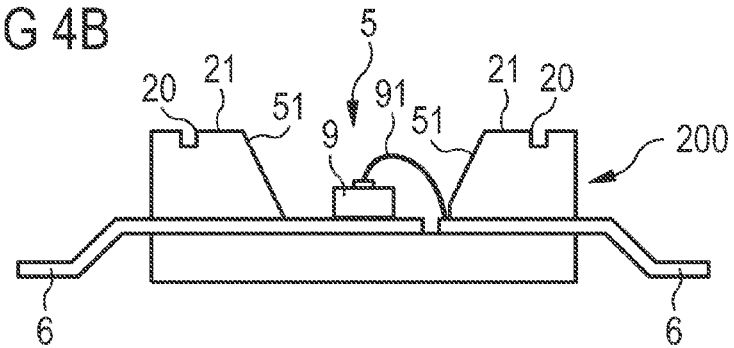
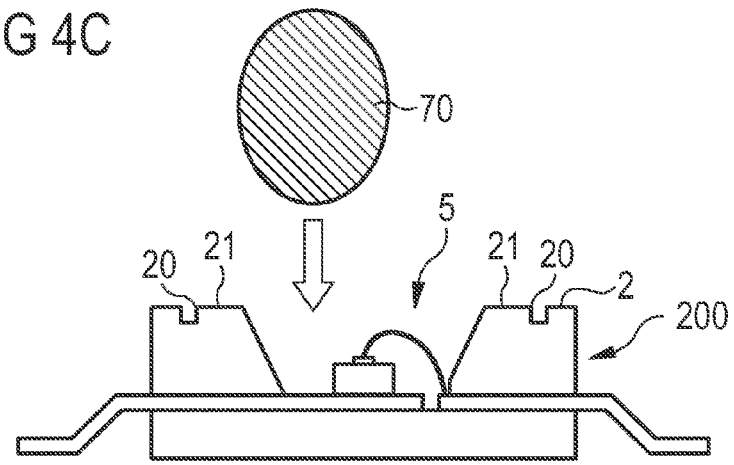
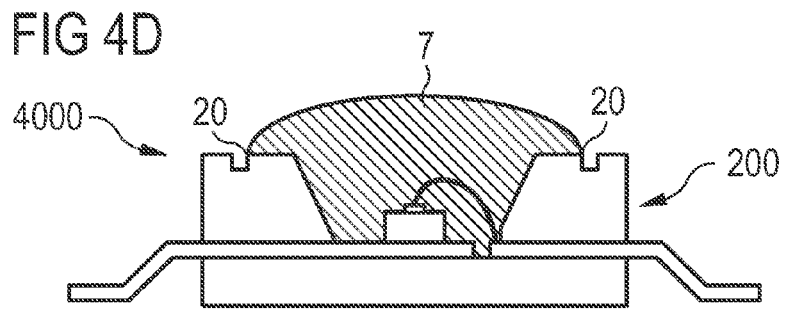

OPTOELECTRONIC DEVICE WITH HOUSING BODY

This patent application is a national phase filing under section 371 of PCT/DE2008/000342, filed Feb. 26, 2008, which claims the priority of German patent applications 10 2007 009 818.0, filed Feb. 28, 2007 and 10 2007 021 904.2 filed May 10, 2007, each of which is incorporated herein by reference in its entirety.

TECHNICAL FIELD

A housing body for an optoelectronic component and an optoelectronic device comprising the housing body are specified.

SUMMARY

Embodiments specify a housing body comprising an optoelectronic component, an optoelectronic device comprising a housing body, and a method for producing an optoelectronic device.

A housing body in accordance with one embodiment of the invention, in particular includes:

a main surface having a first area region and a second area region, wherein the first area region and the second area region form a step in the main surface, the first area region and the second area region adjoin one another by means of an outer edge, and the second area region and the outer edge enclose the first area region.

In addition to the main surface, the housing body can have one or more side areas which adjoin the main surface and delimit and enclose the main surface. In this case, the side areas can be formed in such a way that they connect the main surface to a further surface of the housing body that is arranged on a side of the housing body remote from the main surface.

The first area region and the second area region are formed as partial areas of the main surface, wherein the main surface can have one or more further area regions besides the first and second area regions. The first area region can be formed as an elevation and/or bulge of the main surface or as part thereof. In further embodiments of the invention that can mean, in particular, that the first area region is formed as an elevation at least with respect to further, adjacent area regions of the main surface and the main surface has a non-planar height profile. In this case, the first area region can be a local elevation and/or bulge, which can mean that the first area region is elevated with respect to directly adjoining area regions, including the second area region and further area regions adjoining the latter. In addition, the first area region can also be a global elevation and/or bulge of the main surface. That can mean that the main surface has no area region elevated with respect to the first area region, rather that the first area region is elevated with respect to all other area regions of the main surface.

Furthermore, the first area region and the second area region can directly adjoin one another and form an angle with one another in such a way that the outer edge is formed. In this case, the first area region and the second area region can be formed in non-parallel fashion with respect to one another in the region of the outer edge. In particular, that can mean that the first area region and the second area region each have an area normal and that the two area normals are not parallel to one another at the outer edge. Upon transition from the first to the second area region, therefore, a continuous transition from the area normal of the first area region to the area normal of the second area region does not take place, rather the area normal of the first area region undergoes transition to the area normal of the second area region abruptly, that is to say with a sudden change of direction, at the outer edge.

Furthermore, the outer edge can be the upper edge of the step. The first and second area regions can form a right angle, in particular. As an alternative, the angle can also be less than 90 degrees, such that the housing body can have an outer edge with an acute angle. As an alternative to this, the angle can also be greater than 90 degrees, such that the housing body can have an outer edge with an obtuse angle. In addition, the housing body can have an outer edge with an acute, right or obtuse angle in different regions of the outer edge.

The outer edge can completely surround the first area region, which means that the outer edge can form a continuous marginal line of the first area region which delimits the first area region. At the same time, the outer edge can thereby form a continuous marginal line of the second area region.

In a further embodiment, the first area region is formed in planar fashion. In this case, the first area region can lie in a plane and form a partial region of the plane. In particular, that can also mean that the outer edge is formed in planar fashion, that is to say lies in the same plane as the first area region. In this case, the first area region can be shaped in such a way that the outer edge enclosing the first area region runs around the first area region circularly, elliptically, polyhedrally, that is to say n-gonally where n is greater than or equal to 3, or in a combination thereof. In this case, the outer edge can also be formed in such a way that it is formed, for example, as a polyhedron with rounded corners.

In a further embodiment, the second area region is formed as part of a depression in the main surface, wherein the depression surrounds or encloses the first area region, that is to say is arranged peripherally around the first area region. In this case, the depression can comprise, alongside the second area region, further area regions of the main surface with respect to which the first area region is elevated. In particular, the depression together with the first area region can form the step. In this case, the depression can be formed, for example, as a marginal region of the main surface, such that the depression can adjoin the side areas of the housing body. That can mean that the main surface is formed by the depression and the first area region.

Furthermore, the depression can be formed as a channel, trench and/or groove running, in particular, around the first area region. That can mean that the depression has two delimiting edges, wherein one edge is formed by the outer edge between the first and second area regions. In this case, the depression can have at least two delimiting walls, one delimiting wall of which can have the second area region or can be formed by the latter. In this case, the depression can be formed, in particular, as a continuous closed channel or groove which encloses the first area region and has the same shape as the outer edge between the first and second area regions.

In a further embodiment, the housing body can comprise a plastic, which can be, in particular, a shapeable plastic present in liquid form prior to processing, for instance a thermoplastic or a thermosetting plastic. By way of example, the housing body can be producible by a molding process such as, for instance, transfer molding, injection molding, compression molding, cutting, sawing, milling or a combination thereof. In this case, the plastic can comprise siloxane and/or epoxide groups and be formed for instance as silicone, epoxy resin or a hybrid material composed of a mixture or a copolymer of silicone and epoxide. As an alternative or in addition, the plastic can also comprise polymethyl methacrylate (PMMA), polyacrylate, polycarbonate and/or imide groups.

In addition, the plastic can have optical properties; it can be for instance transparent, naturally or artificially colored, or opaque. Furthermore, the plastic can have a wavelength conversion substance and/or scattering particles such as, for instance, glass or metal oxide particles. The wavelength conversion substance can have, for example, particles from the group of cerium-doped garnets, garnets of rare earths and alkaline earth metals, nitrides, siones, sialones, orthosilicates, sulphides, vanadates, chlorosilicates, and/or halophosphates or mixtures or combinations thereof. In particular, the housing body can also have different regions having different optical properties. As a result, the housing body can be particularly suitable for being a housing body for an optoelectronic component which can generate and emit electromagnetic radiation during operation. The abovementioned optical properties of the plastic make it possible, for example, to change and adapt the emission geometry and/or the emission spectrum of the electromagnetic radiation.

In a further embodiment, the housing body has a leadframe for making electrical contact with an optoelectronic component. In this case, the leadframe can be integrated into the housing body. In particular, that can mean that the housing body is molded around, surrounds and/or is potted around the leadframe. The optoelectronic component can furthermore be mountable on the leadframe. For this purpose, the leadframe can have a mounting region on which the optoelectronic component can be applied. In this case, in particular, an electrical connection of the optoelectronic component to the leadframe can also be possible via the mounting region. The mounting region can be formed, for example, as a mounting area on the leadframe. Furthermore, the leadframe can have a plurality of electrical connection possibilities for making electrical contact with one or more optoelectronic components, formed for instance as bonding pads or as mounting areas.

In a further embodiment, the first area region has a recess which can serve, for example, for receiving the optoelectronic component. In this case, the recess can be formed as an opening, depression and/or indentation in the first area region and thus in the main surface. In this case, the first area region can enclose the recess, in particular. By way of example, the recess can be formed circularly, elliptically, polyhedrally or in a combination thereof. Furthermore, the recess in the main surface can have the same shape as the outer edge or a different shape from the latter. Thus, by way of example, both the outer edge and the recess can be circular or be formed in a different shape mentioned above. As an alternative, the recess can be polyhedral, for example, while the outer edge can be circular. The recess can furthermore have wall areas which adjoin the first area region and which form the side areas of a depression or indentation. The recess can be formed as a depression in such a way that the cross section of the depression can increase or decrease proceeding from the first area region towards the bottom area of the depression, such that the depression can be formed in the shape of a truncated cone, wherein the wall areas can additionally have further openings which can enable, for example, access to a leadframe integrated in the housing body. Furthermore, the recess can have a bottom area which can be embodied, in particular, as a mounting region for the optoelectronic component or can have at least one mounting region or a mounting area. By way of example, the bottom area can comprise a mounting area of a leadframe or be formed from the latter. The wall area and/or the bottom area of the depression can furthermore be formed in reflective fashion and have, for example, a directionally or diffusely reflective surface and/or coating.

At least one embodiment of an optoelectronic device in particular comprises
a housing body comprising a first and a second area region according to at least one of the previous embodiments,
an optoelectronic component, and
a first optical element, wherein,
the optoelectronic component is suitable for emitting electromagnetic radiation during operation, and
the first optical element is arranged on the first area region in the beam path of the optoelectronic component and is delimited by the outer edge.

In particular, the first area region can have a recess, for example, a recess shaped as a depression as described further above, in which the optoelectronic component can be arranged. Furthermore, the recess can comprise a mounting area on which the optoelectronic component can be applied.

The optoelectronic component can have, in particular, one or more optoelectronic semiconductor chips. In particular, an optoelectronic semiconductor chip can be embodied as a radiation-emitting semiconductor chip, for example, as a light-emitting diode (LED). For this purpose, the radiation-emitting semiconductor chip can have a semiconductor layer sequence having an active region suitable for generating electromagnetic radiation during operation of the radiation-emitting semiconductor chip.

In addition, the semiconductor layer sequence can be embodied as an epitaxial layer sequence, that is to say as a semiconductor layer sequence grown epitaxially. The semiconductor layer sequence can be embodied, for example, on the basis of an inorganic material, for instance InGaAlN, such as, for instance, as a GaN thin-film semiconductor layer sequence. InGaAlN-based semiconductor layer sequences include, in particular, those in which the epitaxially produced semiconductor layer sequence, which generally has a layer sequence composed of different individual layers, contains at least one individual layer having a material from the III-V compound semiconductor material system $In_xAl_yGa_{1-x-y}N$ where $0 \leq x \leq 1$, $0 \leq y \leq 1$ and $x+y \leq 1$. As an alternative or in addition, the semiconductor layer sequence can also be based on InGaAlP, that is to say that the semiconductor layer sequence has different individual layers, at least one individual layer of which has a material from the III-V compound semiconductor material system $In_xAl_yGa_{1-x-y}P$ where $0 \leq x \leq 1$, $0 \leq y \leq 1$ and $x+y \leq 1$. As an alternative or in addition, the semiconductor layer sequence can also have other III-V compound semiconductor material systems, for example, an AlGaAs-based material, or II-VI compound semiconductor material systems.

The semiconductor layer sequence can have as an active region, for example, a conventional pn junction, a double heterostructure, a single quantum well structure (SQW structure), or a multiple quantum well structure (MQW structure). The semiconductor layer sequence can comprise, besides the active region, further functional layers and functional regions, for instance p- or n-doped charge carrier transport layers, that is to say electron or hole transport layers, p- or n-doped confinement or cladding layers, buffer layers and/or electrodes and combinations thereof. Such structures concerning the active region or the further functional layers and regions are known to the person skilled in the art, in particular, with regard to construction, function and structure and are therefore not explained in any greater detail at this juncture.

Furthermore, the optoelectronic component can also have at least one radiation-receiving semiconductor chip, for instance a photodiode, which can comprise at least one of the materials mentioned above.

The first optical element can be applied on the first area region, in particular, in direct contact with the first area region and can have a contact area for this purpose. In this case, the contact area can have an outer boundary line which corresponds to and coincides with the outer edge between the first and second area regions of the housing body.

The first optical element can have a curable thermoplastic or thermosetting plastic as explained above in connection with the housing body, that is to say for instance silicones suitable as potting material. In this case, the housing body and the first optical element can have the same plastic or different plastics. Furthermore, the first optical element can be transparent, naturally or artificially colored, and/or partly opaque. Furthermore, the first optical element can have wavelength conversion substances and/or scattering particles. In this case, the first optical element can be embodied as a radiation-refracting element, that is to say for instance as a spherically or aspherically shaped lens.

In a further embodiment, a second optical element can be arranged above the housing body of the optoelectronic device, the optical element being disposed downstream of the first optical element in the beam path of the electromagnetic radiation emitted by the optoelectronic component. In this case, the second optical element can be embodied as a radiation-refracting element, for instance as a spherical or aspherical lens. In addition, the second optical element can be in direct contact with the first optical element. The first optical element and the second optical element can therefore have a contact area with one another. In this case, the first optical element can, for example, also have a refractive-index-matching material or an optical coupling material, for instance a refractive-index-matching gel or oil or an optical coupling gel or oil such as, for example, silicone gel or silicone oil.

A method for producing an optoelectronic device can comprise, in accordance with at least one embodiment, in particular, the following steps of:

A) producing a housing body comprising a first and a second area region according to one of the above-mentioned embodiments around an optoelectronic component, B) applying a liquid material for producing the first optical element on the first area region and above the optoelectronic component in the beam path of the electromagnetic radiation generated by the optoelectronic component.

In addition, in method step A), a housing body having a recess can be used and the optoelectronic component can be arranged in the recess.

In addition, in method step B), the liquid material can propagate after application over the first area region on the latter and cover the second area region as far as the outer edge. What can be achieved by means of the viscosity and the surface tension of the liquid material on the first area region is that the liquid material cannot propagate beyond the outer edge over the second area region, but rather remains at the outer edge.

In particular, the housing body can have a leadframe with a mounting area in the recess, on which the optoelectronic component can be arranged and can be electrically contact-connected.

The liquid material, which can comprise, in particular, a shapeable and curable plastic as described above in liquid, viscous form, can be applied directly over the optoelectronic component and to the first area region. If a recess is present, the liquid material can in this case also be applied into the recess. In particular, the recess can be embodied as a depression which can have a fillable volume. The quantity of the liquid material which is applied on the first area region and above the optoelectronic component in the beam path of the optoelectronic component can be chosen in such a way that the liquid material has a larger volume than the fillable volume of the depression. As a result, the liquid material can fill the depression, for instance by dispensing, printing or "jetting", and furthermore wet the first area region and propagate on the latter. The liquid material can propagate, in particular, as far as the outer edge between the first and second area regions. The composition and/or the viscosity and/or the quantity of the liquid material can be chosen in such a way that the liquid material on account of its surface tension on the first area region cannot propagate further beyond the outer edge over the second area region, but rather is limited to the first area region by the outer edge for instance on account of its surface tension. Since the liquid material cannot propagate beyond the outer edge, the liquid material, on account of its surface tension and its volume, will bulge above the first area region and the optoelectronic component. As a result, a first optical element, for example, in the form of a curved lens can form from the liquid material, and the shape of the element can result from the viscosity and the surface tension and also the quantity of the liquid material in comparison with the fillable volume of the depression in the housing body. The viscosity of the liquid material can be set, for example, by way of its composition and/or by pre-curing or pre-crosslinking of the liquid material prior to application to the housing body.

In an additional method step, after being arranged in the recess, the optoelectronic component can furthermore be potted and thereby encapsulated by means of a plastic, for instance as described further above in connection with the housing body. As a result, the recess can be completely filled, such that with the first area region of the housing body a continuous planar area enclosed by the outer edge can form above the optoelectronic component. The liquid material can then be applied on the area. In accordance with the chosen quantity of the liquid material, the first optical element can then form on the first area region above the optoelectronic component in a manner described above. As an alternative to this, the recess can be only partly filled by means of the additional method step.

As an alternative to the method described above, the optoelectronic component can be arranged and electrically contact-connected on a leadframe. The leadframe with the optoelectronic element can thereupon be at least partly encapsulated by means of a molding process, wherein a housing body in accordance with at least one of the embodiments described above comprising a first and second area region can be formed by means of the molding process. The first optical element can then be formed in the manner described above by applying a liquid material to the first area region and above the optoelectronic component.

After application, the first optical element present as liquid material can be converted into the first optical element in a cured and stable state by drying, curing and/or crosslinking, for example with heat and/or supply of radiation.

A symmetrical and centered shaping and arrangement of the liquid material and thus of the first optical element can be made possible and ensured in a simple manner through the presence of the first area region delimited by the outer edge.

Furthermore, a refractive-index-matching gel, for instance silicone oil, can be used as liquid material. After the liquid material has been applied, a second optical element can be arranged above the housing body, which is directly in contact with the liquid material. On account of the surface tension and the viscosity of the liquid material, the latter will propagate and arrange itself in a manner delimited by the outer edge of the housing body in the interspace formed by the housing body and the second optical element and will form a first optical element formed as an interlayer. In this case, the first area region of the housing body can ensure that the first optical element can be formed in a defined manner in the beam path of the optoelectronic component.

BRIEF DESCRIPTION OF THE DRAWINGS

Further advantages and advantageous embodiments and developments of the invention will become apparent from the embodiments described below in conjunction with FIGS. 1A to 8E.

In the figures:

FIGS. 1A to 2C show schematic illustrations of housing bodies in accordance with some exemplary embodiments, FIGS. 3A to 5E show schematic illustrations of methods for producing optoelectronic devices and optoelectronic devices in accordance with further exemplary embodiments.

Figure 2A:
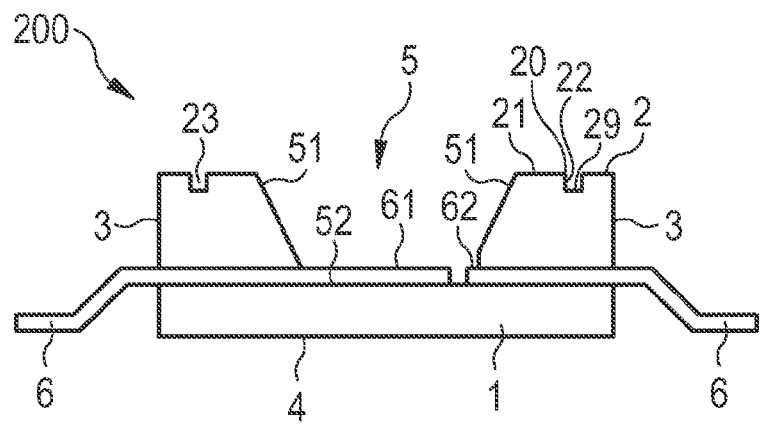

In the exemplary embodiments and figures, identical or identically acting constituent parts can be provided in each case with the same reference symbols. The illustrated elements and their size relationships among one another should in principle not be regarded as true to scale, rather individual elements such as, for example, layers, structural parts, components and regions may be illustrated with exaggerated thickness or size dimensions for the sake of better presentability and/or in order to afford a better understanding.

DETAILED DESCRIPTION OF ILLUSTRATIVE EMBODIMENTS

FIGS. 1A and 1B show two schematic illustrations of a housing body 100 in accordance with one exemplary embodiment. In this case, FIG. 1A shows a schematic sectional illustration along the sectional planes AA in FIG. 1B, while FIG. 1B shows a plan view of the housing body 100. The description below refers equally both to FIGS. 1A and 1B.

The housing body 100 has a shapeable plastic 1, which can be produced from silicone, epoxy resin or a silicone-epoxide hybrid material by means of a molding process. The housing body 100 has a main surface 2 adjoined by side areas 3 that delimit the main surface 2. Furthermore, the housing body 100 has a further surface 4, which is arranged on a side of the housing body 100 that is remote from the main surface 2 and which is connected to the main surface 2 via the side areas 3.

The main surface 2 has a first area region 21. The first area region 21 adjoins a second area region 22, which encloses the first area region 21 and together with the latter forms an outer edge 20 formed in circular fashion. The outer edge 20 thus forms a marginal or boundary line of the first area region 21. The first area region 21 is formed in planar fashion and elevated with respect to the second area region 22, wherein the first area region 21 and the second area region 22 form a step and the outer edge 20 is the upper edge of the step. The second area region 22 is thus part of a depression that surrounds the first area region 21. Furthermore, the main surface 2 has a further area region 29, which adjoins and surrounds the second area region 22.

The housing body 100 has a right angle 25 at the outer edge 20. An enlarged view of the outer edge 20 with the adjoining area regions 21 and 22 is shown as an enlarged excerpt in FIG. 8A. FIGS. 8B to 8E show further exemplary embodiments for the area regions 21, 22 and 29, the outer edge 20 and the angle 25, which will be described in more detail further below.

The housing body 100 can be formed in transparent, colored or partly opaque fashion and/or having scattering particles and/or wavelength conversion substances as described in the general part.

FIG. 2A shows a further exemplary embodiment of a housing body 200.

In contrast to the exemplary embodiment described above, the second area region 22 is formed as part of a channel 23 enclosing the first area region 21. The outer edge 20, which is formed as an upper edge of the step between the channel 23 or the second area region 22 and the first area region 21, likewise has an angle 25 of 90 degrees as in the previous exemplary embodiment.

Furthermore, the housing body 200 has a recess 5 in the first area region 21, the recess being surrounded by the first area region 21. The recess 5 is formed as a depression in the housing body 200 and has wall areas 51 whose cross section decreases proceeding from the first area region 21 through towards a bottom area 52 of the recess 5. Furthermore, the housing body 200 has a leadframe 6, which is integrated into the housing body and has the latter potted around it. The leadframe has in the region of the bottom layer 52 a mounting area 61 and a bonding pad 62, by means of which an optoelectronic component can be mounted and electrically connected to the leadframe 6.

In the exemplary embodiment shown, the housing body 200 has an opaque plastic, for instance silicone, epoxy resin or a hybrid material, wherein the wall areas 51 are formed in reflective fashion.

Figure 2B:
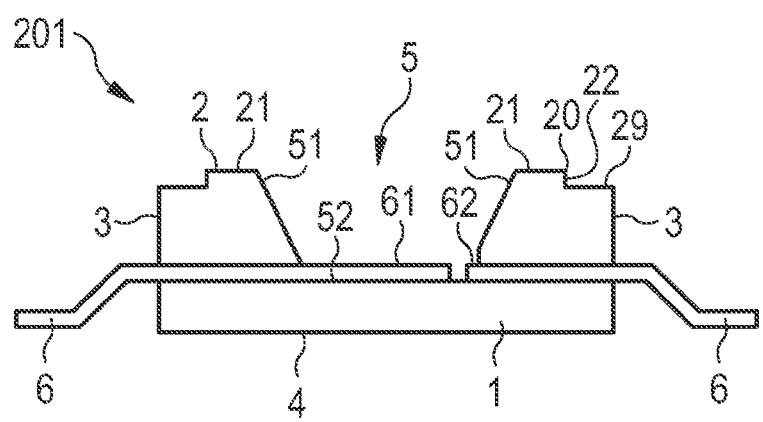
Figure 2C:
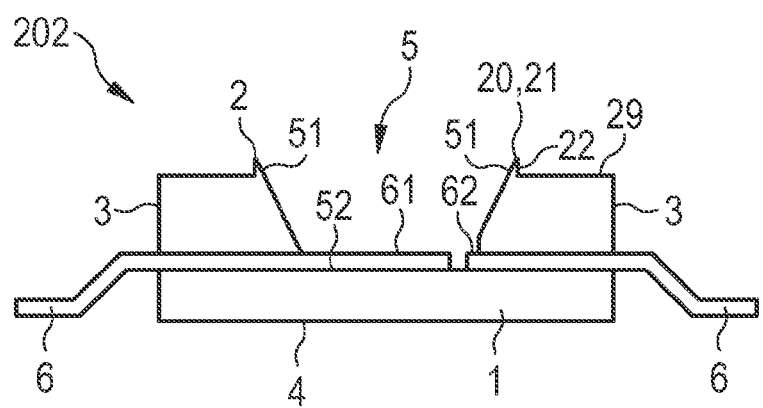

FIGS. 2B and 2C show further exemplary embodiments of housing bodies 201, 202. In this case, like the housing body 100 in FIGS. 1A and 1B, the housing body 201 in FIG. 2B has a step formed by the first area region 21, the second area region 22 and the area region 29, the step surrounding a recess 5. In the case of the housing body 202 in FIG. 2C, the extent of the first area region 21 is reduced to a ring, wherein the first area region 21 can also coincide with the outer edge 20.

FIGS. 3A to 3E show a method for producing an optoelectronic device 3000 comprising a housing body 100 in accordance with the exemplary embodiment of FIGS. 1A and 1B.

Figure 3A:
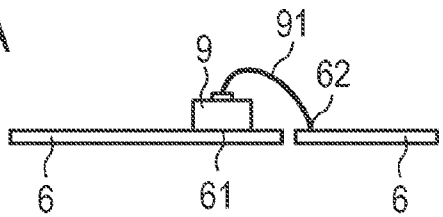

In a first method step, shown in FIG. 3A, a leadframe 6 is provided, on which an optoelectronic component 9, for example, a radiation-emitting semiconductor chip as described in the general part, is mounted on the mounting area 61 and electrically connected to the latter and is electrically connected to the bonding pad 62 of the leadframe 6 via a bonding wire 91.

Figure 3B:
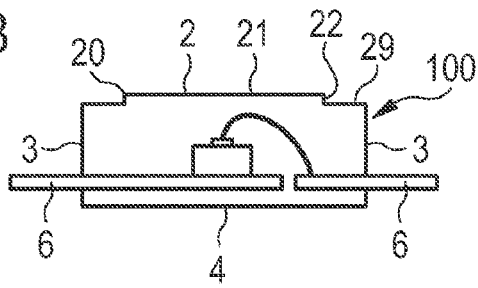

In a next method step, as shown in FIG. 3B, the leadframe 6 and the optoelectronic component 9 are encapsulated by molding by means of a plastic and a housing body 100 as described in conjunction with the exemplary embodiment of FIGS. 1A and 1B is formed.

Figure 3C:
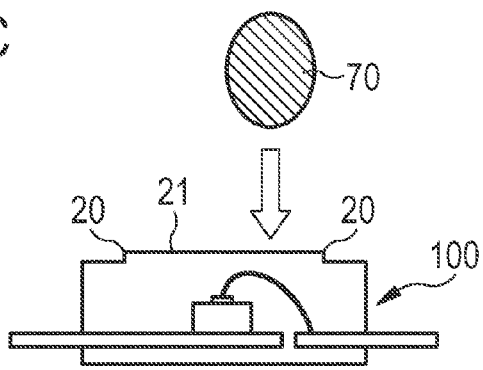

Afterwards, as shown in FIG. 3C, a liquid material 70 is applied above the optoelectronic component 9 and on the first area region 21. In this case, the liquid material, which, in the exemplary embodiment shown, has transparent silicone and/ or epoxy resin alone or as a mixture or hybrid material, does not have to be applied in centered fashion and centrally above the first area region 21. In accordance with the tolerances of the application device, for instance a nozzle or a needle, and also the separating behavior of the liquid material 70 from the application device, the liquid material 70 can be applied at any desired location on the first area region 21.

Figure 3D:
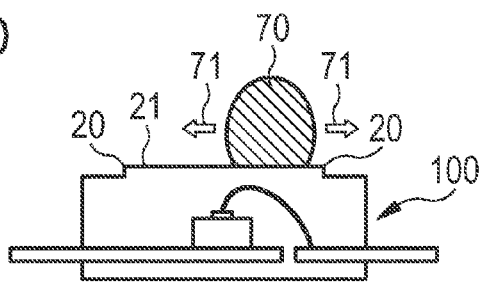
Figure 3E:
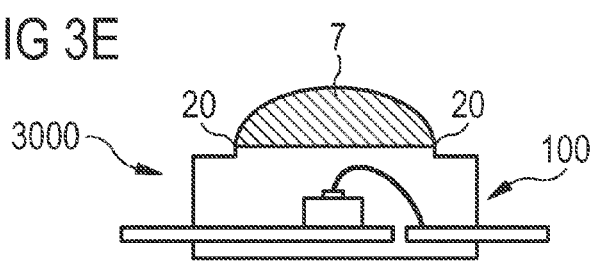

As shown in FIG. 3D, the liquid material 70 propagates after application on the first area region 21, as is indicated by the arrows 71. On account of the viscosity and the surface tension of the liquid material 70 on the area region 21, the liquid material propagates uniformly on the first area region 21 and is delimited by the outer edge 20. As a result, as shown in FIG. 3E, a uniformly and symmetrically shaped first optical element 7 in the form of a curved lens can form in a still liquid state. On account of the wetting angle predetermined by the surface tension, the liquid material 70 cannot flow beyond the outer edge 20 also over the second area region 22 since, owing to the outer edge 20, the wetting angle on the second area region 22 would be too great for this. On a planar main surface 2 without a first area region 21 elevated above the second area region 22, it would not be possible to obtain such a defined geometry of the first optical element 7 with the method described.

The optoelectronic device 3000 can thus be produced by subsequently curing the optical element 7.

FIGS. 4A to 4D show a further method for producing an optoelectronic device 4000 comprising a housing body 200 in accordance with the exemplary embodiment of FIG. 2A. In this case, one of the housing bodies 201 and 202 of FIGS. 2B and 2C could also be used instead of the housing body 200 of FIG. 2A.

In this case, in a first method step, a housing body 200 is provided (FIG. 4A), in which an optoelectronic component 9 is mounted and electrically connected, as shown in FIG. 4B.

In a further method step, as shown in FIG. 4C, a liquid material 70, as described in conjunction with the previous method, is applied above the optoelectronic component 9 and to the first area region 21. In this case, the quantity of the liquid material 70 is greater than the fillable volume of the depression 5 of the housing body 200. As a result, the liquid material can completely fill the depression 5 and furthermore propagate over the first area region 21 as far as the outer edge 20 and in the process form a symmetrically and uniformly shaped first optical element 7. The lens shape of the first optical component 7 which can thus be achieved makes it possible, for example, to increase the light coupling-out of the electromagnetic radiation emitted by the optoelectronic component 9.

Consequently, by means of the method shown, it is possible to enable both a potting of the optoelectronic component 9 and a defined lens shape by means of the first optical component 7, the size of which can be determined in a simple manner by the geometry and the position of the outer edge 20.

FIGS. 5A to 5E show a further method for producing an optoelectronic device 5000 comprising a housing body 200, which represents a variant of the method described previously.

Figure 5A:
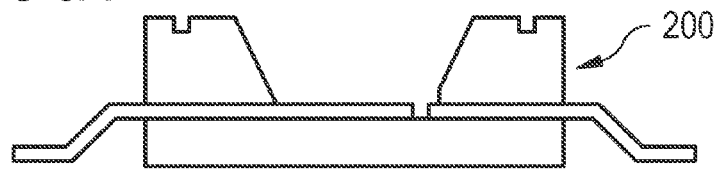
Figure 5B:
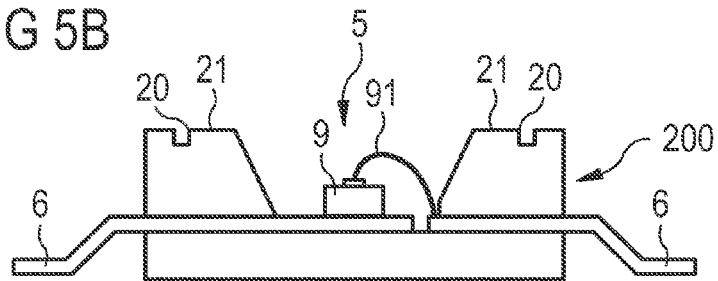
Figure 5C:
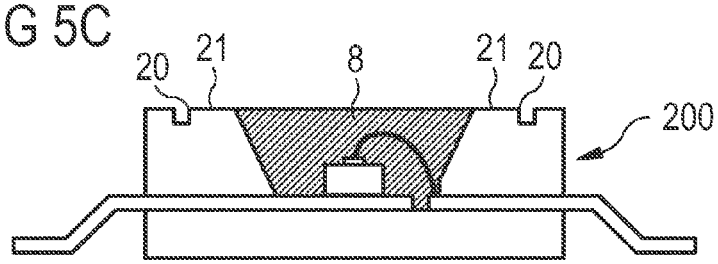

After providing the housing body 200 (FIG. 5A) and mounting the optoelectronic component 9 (FIG. 5B), a potting is applied above the optoelectronic component 9 in the depression 5, as shown in FIG. 5C. In this case, the potting 8 can have for instance a plastic like the housing body 200. In this case, the potting 8 is transparent and/or has scattering particles or wavelength conversion substances.

Figure 5D:
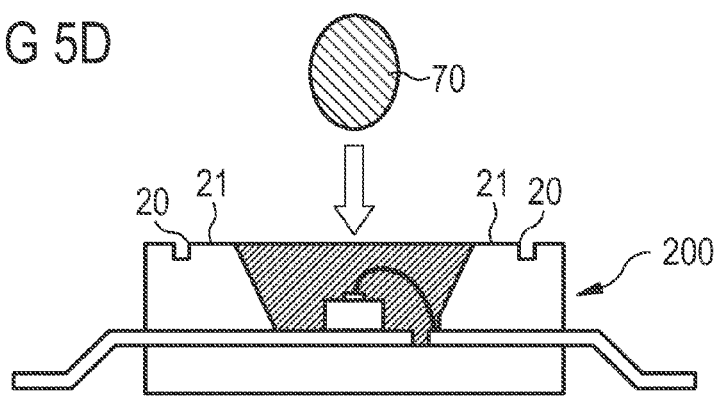
Figure 5E:
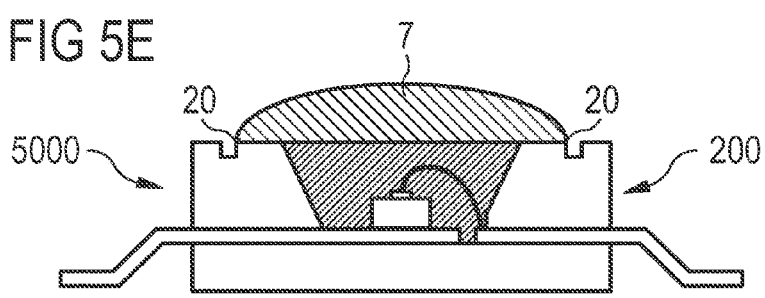

The potting 8 results in a continuous area with the first area region 21, on which, in a further method step as shown in FIG. 5D, the liquid material 70 is applied, which, as shown in FIG. 5E, forms the first optical element 7, which can subsequently be cured. The first optical element 7 can be clear and transparent, for example, while the potting 8 can have wavelength conversion substances, for example, such that the method shown can enable an optoelectronic device 5000 in which the potting 8 can have different optical properties from the first optical element 7.

The bottom shape of the first optical element 7 on the potting 8 and the first area region 21 results automatically from the shape of the outer edge 20 in conjunction with the geometry and position of the first area region 21 and of the potting 8, while the height of the lens formed and also the optical properties of the lens can be established by way of the quantity and the material properties of the liquid material 70.

Experiments have shown that, for example, first optical elements 7 in the form of curved lenses having a height of approximately 1.50 mm to approximately 1.66 mm can be produced reproducibly using approximately 20 μl of silicone or silicone gel, while curved lenses having a height of approximately 1.65 mm to approximately 1.75 mm could be produced using approximately 22 μl of silicone or silicone gel. In this case, the height of the first optical element 7 is also dependent on the dimensioning and shape of the outer edge 20 in the first area region 21. In this case, the outer edge 20 in the first area region 21 was circular with a diameter of approximately 5 mm. The height tolerances were attributable to variations in the height of the potting 8 in the recess 5 and to process tolerances, while the position on which the liquid material 70 was applied on the first area region 21 and the potting 8 had no influence on the shape of the first optical element 7.

Figure 6A:
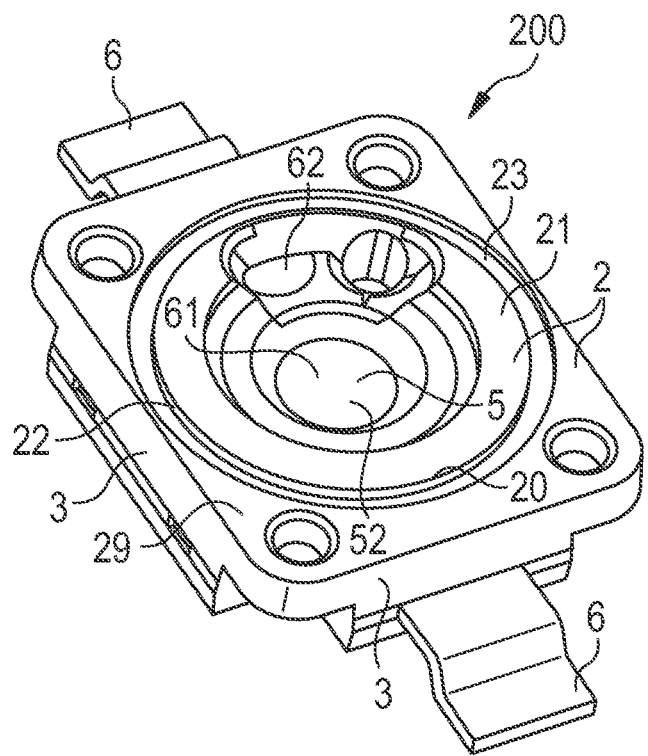
FIGS. 6A and 6B show schematic illustrations of a housing body and an optoelectronic device in accordance with further exemplary embodiments.
Figure 6B:
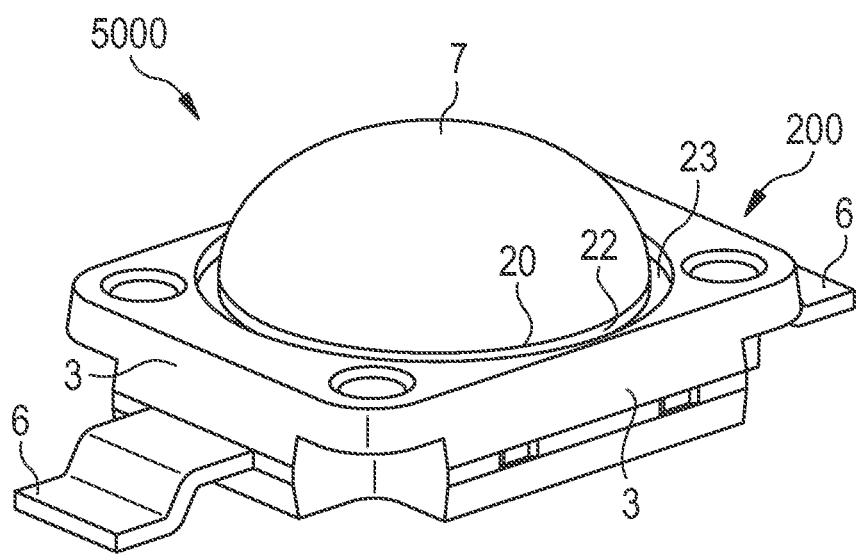

FIG. 6A shows a three-dimensional schematic view of the housing body 200 in accordance with the description in conjunction with FIG. 2, while FIG. 6B shows a three-dimensional schematic view of the optoelectronic device 5000 comprising a first optical element 7 in accordance with the description in conjunction with FIG. 5E.

Figure 7A:
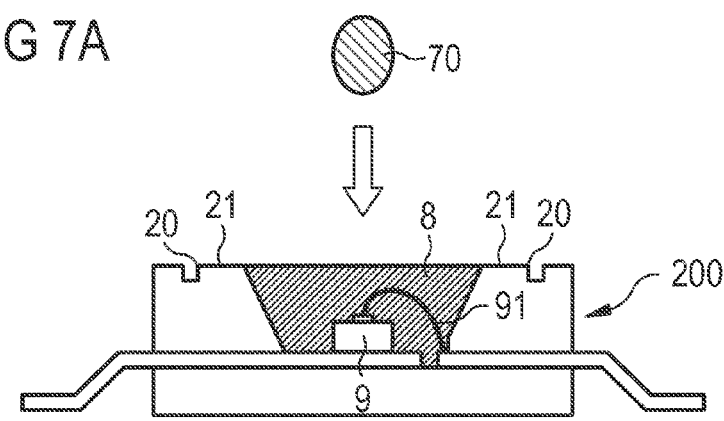
FIGS. 7A to 7D show schematic illustrations of a method for producing an optoelectronic device and optoelectronic devices in accordance with further exemplary embodiments.
Figure 7B:
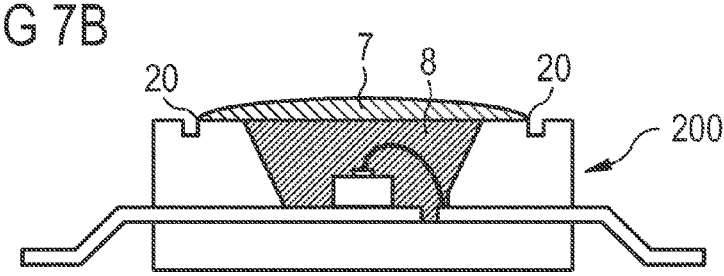
Figure 7C:
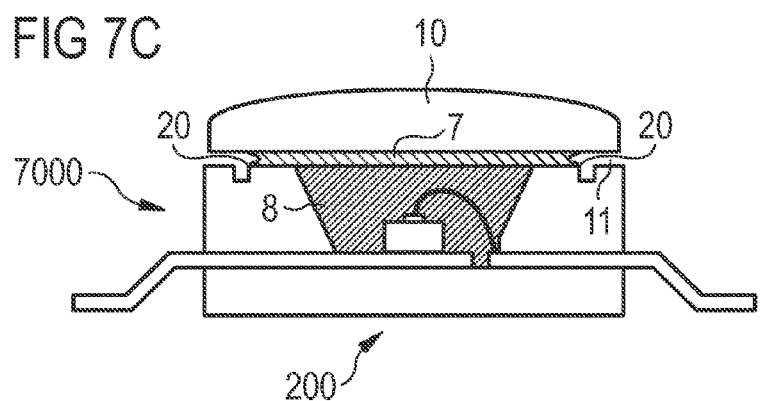

FIGS. 7A to 7C show a further method for producing an optoelectronic device 7000. As in the previous exemplary embodiment in accordance with FIGS. 5A to 5E, a housing body 200 is provided, in which an optoelectronic component 9 is mounted and electrically connected. Afterwards, the recess 5 is filled with a potting 8 and the optoelectronic component 9 is therefore potted. As shown in FIG. 7A, liquid material 70 in the form of silicone oil or some other suitable optical coupling gel is applied over the potting 8 and the first area region 21, is distributed as far as towards the outer edge 20 (FIG. 7B) and forms the first optical element 7, which, however, is viscous and thus deformable. A second optical element 10, for instance a lens, is thereupon arranged above the housing body 200 and the first optical element 7 in an emission direction of the optoelectronic component 9. In this case, the second optical element 10 is in direct contact with the first optical element 7. By virtue of the viscosity and the surface tension of the first optical element 7, the first optical element 7 is arranged between the housing body 200 and the second optical element 10 in the interspace 11 in a manner centered with respect to the second optical element 10 and the optoelectronic component 9, such that an optimum optical coupling of the second optical element 10 can be ensured.

As an alternative, the method shown in FIGS. 7A to 7C is also possible without potting 8 in the recess 5.

Figure 7D:
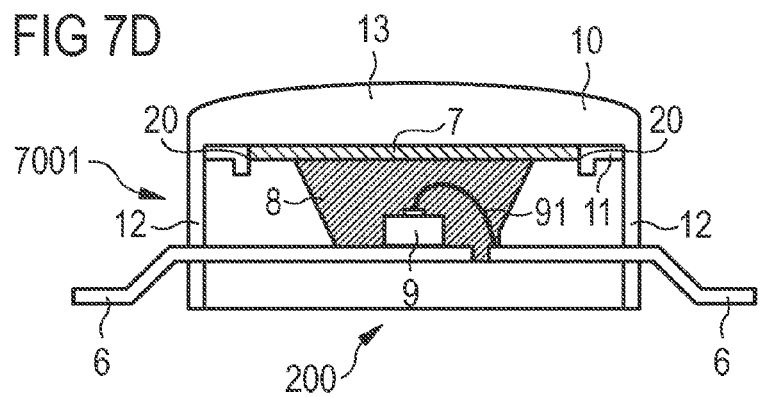

FIG. 7D shows a further exemplary embodiment of an optoelectronic device 7001, which can be produced according to the method mentioned previously. As an alternative to the optoelectronic device 7000 in accordance with FIG. 7C, the optoelectronic device 7001 has a second optical element 10, which, alongside a region 13 that fulfils the actual optical function of the second optical element 10, as for example a lens body having curved surfaces for refracting light beams, additionally has centering aids 12 which facilitate centered fitting and/or fixing of the second optical element to the housing body 200. In particular, the centering aids 12 of the second optical element 10 can also be such that after the arrangement of the second optical element 10 on or at the housing body 200, a defined interspace 11 results in which the first optical element 7 is arranged.

Figure 8A:
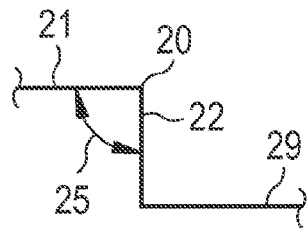
FIGS. 8A to 8E show schematic illustrations of features of housing bodies in accordance with further exemplary embodiments.
Figure 8B:
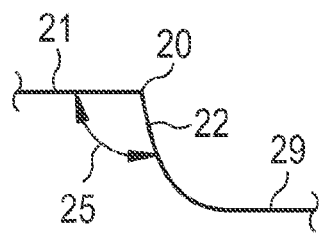

The exemplary embodiments of FIGS. 8A to 8E show excerpts from the step formed by the first and second area regions of a housing body, wherein the housing body can be formed, for example, as in the exemplary embodiment in accordance with FIGS. 1A and 1B or else as in the exemplary embodiments in accordance with FIGS. 2A to 2C. In the case of the housing body 200 of FIG. 2A, FIGS. 8A to 8B show excerpts from the channel 23.

FIG. 8A shows the exemplary embodiment—already shown in connection with FIGS. 1A, 1B and 2—for the outer edge 20 and the angle 25 formed as a right angle.

FIG. 8B likewise shows a step of a housing body having an outer edge 20 having a right angle 25, wherein however the second area region 22 is curved and merges into the further area region 29 without a further edge.

Figure 8C:
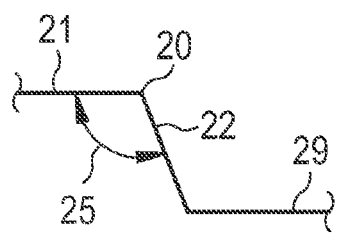

In FIG. 8C, the housing body has an angle 25 of greater than 90 degrees at the outer edge 20. As a result, the outer edge 20 forms an upper edge of the step formed by the area regions 21 and 22, which has an obtuse angle. In this case, the angle 25 can be all the greater, the higher the surface tension of the liquid material to be applied.

Figure 8D:
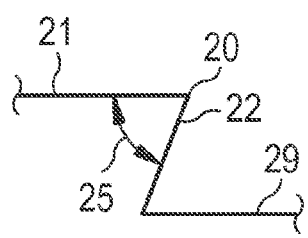

FIG. 8D shows an outer edge 20 with an acute angle 25, such that the housing body has an angle of less than 90 degrees at the outer edge 20. As a result, the first area region 21 is formed in a manner partly overhanging the second area region 22.

Figure 8E:
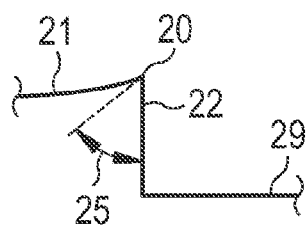

FIG. 8E shows a step of a housing body in which the first area region 21 is not formed in planar fashion, but rather is curved upwards towards the outer edge 20. As a result, the outer edge 20 has an acute angle 20 of less than 90 degrees.

The invention is not restricted to the exemplary embodiments by the description on the basis of the exemplary embodiments. Rather, the invention encompasses any new feature and also any combination of features, which, in particular, comprises any combination of features in the patent claims, even if this feature or this combination itself is not explicitly specified in the patent claims or exemplary embodiments.

The invention claimed is:

1. An optoelectronic device, comprising:
 a housing body comprising a main surface having a first area region and a second area region, wherein the first area region and the second area region form a step in the main surface, wherein the first area region and the second area region adjoin one another by means of an outer edge, and wherein the second area region and the outer edge enclose the first area region;
 an optoelectronic component adjacent the housing body, the optoelectronic component suitable for emitting electromagnetic radiation during operation;
 a first optical element arranged on the first area region in a beam path of the optoelectronic component and being delimited by the outer edge, wherein the first optical element is in a liquid form; and
 a second optical element arranged above the housing body, the second optical element being disposed downstream of the first optical element in the beam path, wherein the second optical element is in direct contact with the first optical element in the liquid form.

2. The optoelectronic device according to claim 1, wherein the housing body comprises at least one material selected from the group consisting of silicone, epoxide and silicone-epoxide hybrid material.

3. The optoelectronic device according to claim 1, wherein the first area region comprises a planar region.

4. The optoelectronic device according to claim 1, wherein the outer edge runs around the first area region circularly, elliptically, polyhedrally or in a combination thereof.

5. The optoelectronic device according to claim 1, wherein the second area region is part of a depression in the main surface, and the depression surrounds the first area region.

6. The optoelectronic device according to claim 5, wherein the depression together with the first area region forms the step.

7. The optoelectronic device according to claim 5, wherein the depression comprises a channel enclosing the first area region.

8. The optoelectronic device according to claim 5, wherein the housing body comprises a shapeable plastic.

9. The optoelectronic device according to claim 2, wherein the housing body comprises epoxide.

10. The optoelectronic device according to claim 1, wherein the housing body comprises a leadframe.

11. The optoelectronic device according to claim 10, wherein the leadframe has a mounting area for the optoelectronic component.

12. The optoelectronic device according to claim 1, wherein the first area region has a recess for receiving the optoelectronic component, and the first area region encloses the recess.

13. The optoelectronic device according to claim 12, wherein the recess has a mounting region for the optoelectronic component.

14. The optoelectronic device according to claim 1, wherein the housing body has a recess in the first area region, and the first area region enclosing the recess, and wherein the optoelectronic component is arranged in the recess.

15. The optoelectronic device according to claim 1, wherein the first optical element comprises a plastic.

16. The optoelectronic device according to claim 1, wherein the first optical element comprises a refractive-index-matching material.

17. The optoelectronic device according to claim 1, wherein the first optical element comprises silicone gel or silicone oil.

18. The optoelectronic device according to claim 2, wherein the housing body comprises silicone.

19. The optoelectronic device according to claim 2, wherein the housing body comprises the silicone-epoxide hybrid material.

20. A method for producing an optoelectronic device, the method comprising:
 forming a housing body around an optoelectronic component, the housing body comprising a main surface having a first area region and a second area region, wherein, the first area region and the second area region form a step in the main surface, wherein the first area region and the second area region adjoin one another by means of an outer edge, and wherein the second area region and the outer edge enclose the first area region;
 locating the optoelectronic component at the first area region;

applying a liquid material for producing a first optical element on the first area region and above the optoelectronic component in a beam path of electromagnetic radiation generated by the optoelectronic component; and forming a second optical element arranged above the housing body, the second optical element being disposed downstream of the first optical element in the beam path, wherein the second optical element is in direct contact with the liquid material of the first optical element such that the first optical element remains a liquid in the optoelectronic device.

21. The method according to claim 20, wherein forming the housing body comprises forming a housing body having a recess and wherein locating the optoelectronic component comprises locating the optoelectronic component in the recess.

22. The method according to claim 20, wherein applying the liquid material comprises causing the liquid material to propagate after applying over the first area region as far as the outer edge, and the liquid material being delimited by the outer edge.

23. The method according to claim 21, further comprising encapsulating the optoelectronic component in the recess by means of a plastic.

24. The method according to claim 20, wherein the liquid material comprises silicone and/or epoxide or silicone oil.

* * * * *

UNITED STATES PATENT AND TRADEMARK OFFICE
CERTIFICATE OF CORRECTION

PATENT NO. : 8,723,211 B2  
APPLICATION NO. : 12/529151  
DATED : May 13, 2014  
INVENTOR(S) : Kirsch et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 287 days.

Signed and Sealed this

Twenty-ninth Day of September, 2015

Michelle K. Lee
*Director of the United States Patent and Trademark Office*